(12) United States Patent
Cho et al.

(10) Patent No.: US 7,323,917 B2
(45) Date of Patent: Jan. 29, 2008

(54) METHOD AND APPARATUS FOR SYNTHESIZING A CLOCK SIGNAL HAVING A FREQUENCY NEAR THE FREQUENCY OF A SOURCE CLOCK SIGNAL

(75) Inventors: James B. Cho, Plano, TX (US); Christian Harrieder, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 483 days.

(21) Appl. No.: 10/662,596

(22) Filed: Sep. 15, 2003

(65) Prior Publication Data

US 2005/0060616 A1   Mar. 17, 2005

(51) Int. Cl.
*H04L 7/00* (2006.01)
(52) U.S. Cl. .......................... 327/158; 327/156; 331/34
(58) Field of Classification Search ........ 327/156–158, 327/147–149; 331/34, 45; 714/34; 375/371
See application file for complete search history.

(56) References Cited

U.S. PATENT DOCUMENTS

| | | | |
|---|---|---|---|
| 5,859,606 A | 1/1999 | Schrader et al. | 341/144 |
| 6,335,644 B1 | 1/2002 | Carbone | 327/141 |
| 6,356,122 B2 | 3/2002 | Sevalia et al. | 327/105 |
| 6,525,615 B1 * | 2/2003 | Masenas et al. | 331/34 |
| 6,583,655 B2 | 6/2003 | Takahashi et al. | 327/160 |
| 6,650,157 B2 * | 11/2003 | Amick et al. | 327/158 |
| 6,753,712 B2 * | 6/2004 | Saeki | 327/165 |
| 6,801,066 B2 * | 10/2004 | Lee | 327/119 |
| 6,888,387 B2 * | 5/2005 | Saeki | 327/163 |
| 2003/0117864 A1 * | 6/2003 | Hampel et al. | 365/200 |

OTHER PUBLICATIONS

*ECE1352 Analog Integrated Circuits Reading Assignment: Phase Interpolating Circuits*, Kostas Pagiamtzis, Nov. 12, 2001, pp. 1-19.

* cited by examiner

Primary Examiner—Dinh T. Le
(74) Attorney, Agent, or Firm—Wade James Brady, III; Frederick J. Telecky, Jr.

(57) ABSTRACT

An apparatus and method of synthesizing an output clock signal from a source clock signal. The clock synthesizer includes a phase generator, a phase selector, a phase interpolator, and control circuitry for controlling the phase selector/interpolator. The phase generator receives a high speed clock, and generates P phases of the source clock to define P phase sectors. The phase selector selects respective pairs of phases such that each pair bounds a respective phase sector. The phase interpolator introduces at least one phase of the source clock between each pair of phases to provide Q phases of the source clock within each sector. The phase interpolator uses the phases of the source clock to produce lagging (leading) phase shifts of $360/P(Q-1)$ degrees, thereby generating the output clock having a stepped up or stepped down frequency.

25 Claims, 7 Drawing Sheets

METHOD AND APPARATUS FOR SYNTHESIZING A CLOCK SIGNAL HAVING A FREQUENCY NEAR THE FREQUENCY OF A SOURCE CLOCK SIGNAL

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to clock synthesizers, and more particularly to a clock synthesizer for synthesizing an output clock signal having a frequency near that of a source clock signal.

Clock synthesizers are known for deriving one or more output clock signals from a source clock signal. Such clock synthesizers are employed in various applications including error detection and/or correction schemes used in the transmission of serial data. When performing error detection and/or correction, a serial data transmission system typically employs data encoding and decoding techniques, in which one or more extra bits are added to an original data stream during transmission and subsequently removed from the data stream to recover the original data. In the serial data transmission system, a clock synthesizer typically generates a clock signal having a stepped up frequency for use in increasing the transmission rate of the encoded data stream (i.e., the data stream including the extra bits). After the extra bits are removed to produce the decoded data stream, the clock synthesizer typically steps down the clock frequency to return to the original data transmission rate.

However, using a clock synthesizer to generate desired stepped up/stepped down clock frequencies in a serial data transmission system can be problematic. For example, the desired step up (step down) in frequency must be precisely performed to match the increase (decrease) of the data transmission rate after encoding (decoding) the data. For example, in the event the data encoding adds one extra bit for every 16 bits of the original data stream, the ratio of the original data transmission rate to the stepped up clock frequency must be 16/17. Alternatively, in the event the data encoding adds one extra bit for every 32 bits of the original data stream, the ratio of the original data transmission rate to the stepped-up frequency must be 32/33. The frequency difference between the clock signals employed with the original data stream and the encoded data stream can therefore be relatively small.

Conventional clock synthesizers capable of precise frequency generation typically employ a Phase Locked Loop (PLL). However, PLL-based clock synthesizers have drawbacks in that they are relatively costly and bulky and typically consume a significant amount of power. These drawbacks can preclude the implementation of PLL-based clock synthesizers within low-cost low-power Integrated Circuits (ICs).

Alternative clock synthesizer configurations may include a counter capable of counting to N to generate a first clock frequency and effectively blanking out the $N^{th}$ pulse to generate a reduced clock frequency. However, such clock synthesizer configurations employing counters also have drawbacks in that they are typically only used for providing a step down in frequency and are generally not used in applications that require both stepped up and stepped down clock frequencies.

It would therefore be desirable to have an improved clock synthesizer that provides a desired step up/step down in clock frequency and avoids the drawbacks of conventional clock synthesizers.

BRIEF SUMMARY OF THE INVENTION

In accordance with the present invention, an apparatus and method of synthesizing a clock signal is disclosed that can be used for incrementally increasing/decreasing the frequency of an output clock signal derived from a source clock signal, while allowing a relatively easy implementation within an Integrated Circuit (IC). Benefits of the presently disclosed clock synthesizer are achieved by employing a phase interpolator for effectively inserting (removing) at least one cycle into (from) the source clock signal over a predetermined number of source clock cycles to derive an output clock signal having a desired stepped up (stepped down) clock frequency.

In one embodiment, the clock synthesizer comprises a phase generator, a phase selector, a phase interpolator, and control circuitry for controlling the phase selector/interpolator. The phase generator is configured to receive a high speed clock signal, and to generate P (P≧4) evenly spaced phases of the source clock signal. The P phases of the source clock signal define P phase sectors spanning from 0° to 360°. The phase selector is configured to receive the P phases of the source clock signal, and to select respective pairs of phases such that each pair bounds a respective one of the P phase sectors. The phase interpolator is configured to receive the selected phases of the source clock signal, and to introduce at least one phase of the source clock signal between each pair of phases to provide Q evenly spaced phases of the source clock signal within each one of the P phase sectors. The phase selector/interpolator control circuitry comprises a Finite State Machine (FSM) clocked by a selected one of the P phases of the source clock signal. The FSM is operative to provide a plurality of control signals to the phase selector/interpolator to allow the phase interpolator to use the phases of the source clock signal for producing lagging or leading phase shifts of 360/P(Q−1), thereby generating an output clock signal having at least one clock cycle more (or less) than the source clock signal over a predetermined number of source clock cycles.

By employing a phase interpolator in a clock synthesizer for effectively inserting (removing) at least one clock cycle into (from) a source clock signal over a predetermined number of source clock cycles, desired stepped up (stepped down) clock frequencies can be generated in a circuit configuration that is easily implementable within an IC.

Other features, functions, and aspects of the invention will be evident from the Detailed Description of the Invention that follows.

BRIEF DESCRIPTION OF THE SEVERAL VIEWS OF THE DRAWING

The invention will be more fully understood with reference to the following Detailed Description of the Invention in conjunction with the drawings of which:

FIG. 2b is a timing diagram illustrating a plurality of clock phases generated by the phase generator of FIG. 2a;

DETAILED DESCRIPTION OF THE INVENTION

An apparatus and method of synthesizing a clock signal is provided that is capable of incrementally increasing/decreasing the frequency of an output clock signal derived from a source clock signal, while allowing a relatively easy implementation within an Integrated Circuit (IC). The clock synthesizer employs a phase interpolator for effectively inserting (removing) at least one cycle into (from) the source clock signal over a predetermined number of source clock cycles to derive an output clock signal having a desired stepped up (stepped down) clock frequency.

Figure 1:
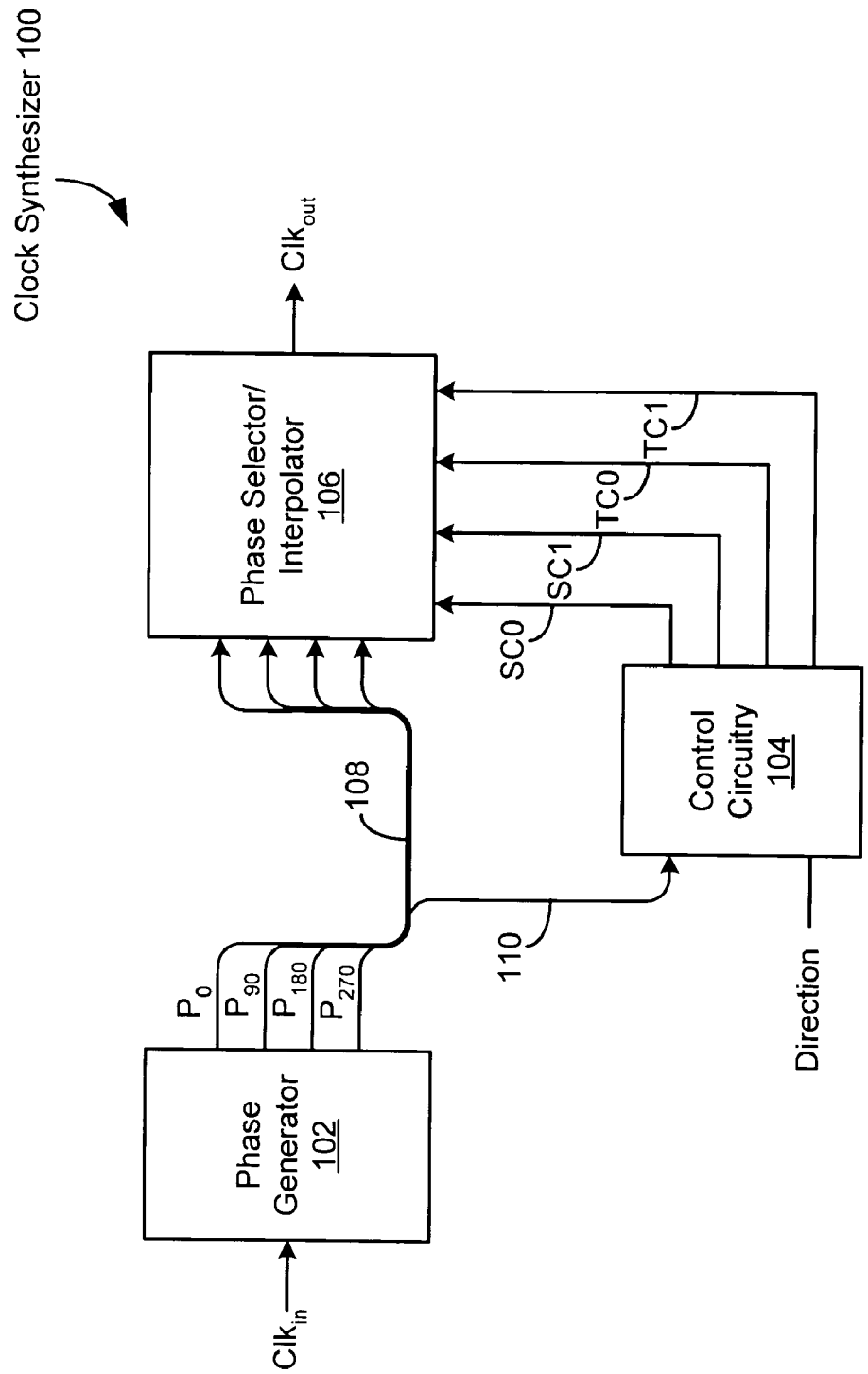
FIG. 1 is a block diagram of a clock synthesizer according to the present invention.

FIG. 1 depicts an illustrative embodiment of a clock synthesizer 100, in accordance with the present invention. In the illustrated embodiment, the clock synthesizer 100 comprises a phase generator 102, a phase selector/interpolator 106, and control circuitry 104 for controlling the phase selector/interpolator 106. As shown in FIG. 1, the phase generator 102 receives a high speed clock signal $Clk_{in}$, and provides four phases $P_0$, $P_{90}$, $P_{180}$, and $P_{270}$ of a source clock. In the presently disclosed embodiment, the frequency of the high speed clock $Clk_{in}$ is two times the frequency of the source clock.

It should be noted, however, that the frequency of the high speed clock $Clk_{in}$ may alternatively be four times that of the source clock or any other suitable frequency higher than the source clock frequency. It is further noted that the phases $P_0$, $P_{90}$, $P_{180}$, and $P_{270}$ comprise four essentially evenly spaced phases (90° apart) of the source clock. In the preferred embodiment, the phase generator 102 provides four or more evenly spaced phases of the source clock. It should be understood that any other suitable number of evenly spaced phases of the source clock may alternatively be employed.

As shown in FIG. 1, the phase selector/interpolator 106 receives the phases $P_0$, $P_{90}$, $P_{180}$, and $P_{270}$ of the source clock, and provides the output clock signal $Clk_{out}$ having a desired stepped up or stepped down clock frequency. The control circuitry 104 receives a selected one of the four phases $P_0$, $P_{90}$, $P_{180}$, and $P_{270}$ via a line 110 along with an interpolation direction control signal ("Direction"), and provides a plurality of control signals including Sector Codes SC0, SC1 and Thermometer Codes TC0, TC1 to the phase selector/interpolator 106, which employs the control signals SC0, SC1, TC0, and TC1 to derive the output clock $Clk_{out}$ from the phases $P_0$, $P_{90}$, $P_{180}$, and $P_{270}$ of the source clock.

Figure 2A:
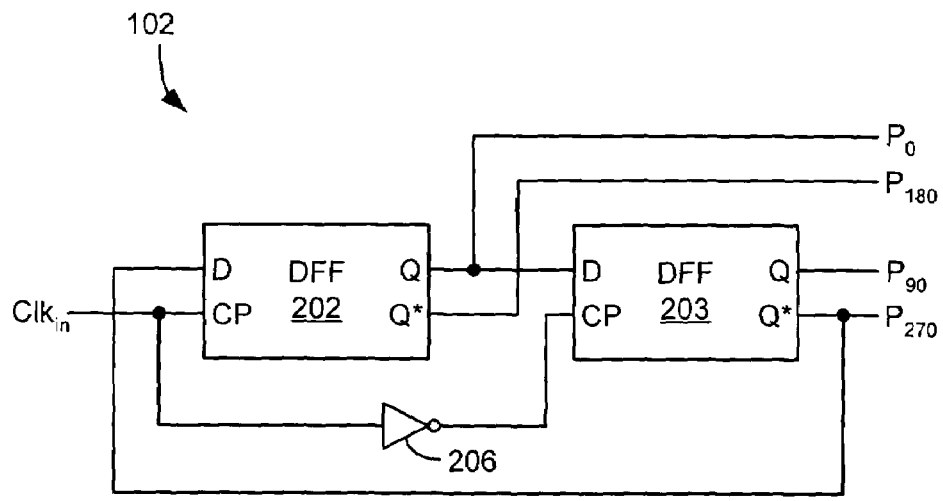
FIG. 2a is a schematic diagram of a phase generator included in the clock synthesizer of FIG. 1.

FIG. 2a depicts an illustrative embodiment of the phase generator 102 included in the clock synthesizer 100 (see FIG. 1). As shown in FIG. 2a, the phase generator 102 includes a plurality of D-Flip-Flops (DFFs) 202-203 and an inverter 206, which are interconnected to function as a Toggle-Flip-Flop (TFF). The DFF 202 receives the high speed clock $Clk_{in}$ at its Clock Pulse (CP) input, and the DFF 203 receives an inverted form of the source clock $Clk_{in}$ at its CP input via the inverter 206. Further, the not-Q (Q*) output of the DFF 203 is fed back to the Data (D) input of the DFF 202, and the Q output of the DFF 202 is provided to the D input of the DFF 203. As a result, the phases $P_0$ and $P_{180}$ of the source clock are provided at the Q and Q* outputs, respectively, of the DFF 202, and the phases $P_{90}$ and $P_{270}$ of the source clock are provided at the Q and Q* outputs, respectively, of the DFF 203.

Figure 2B:
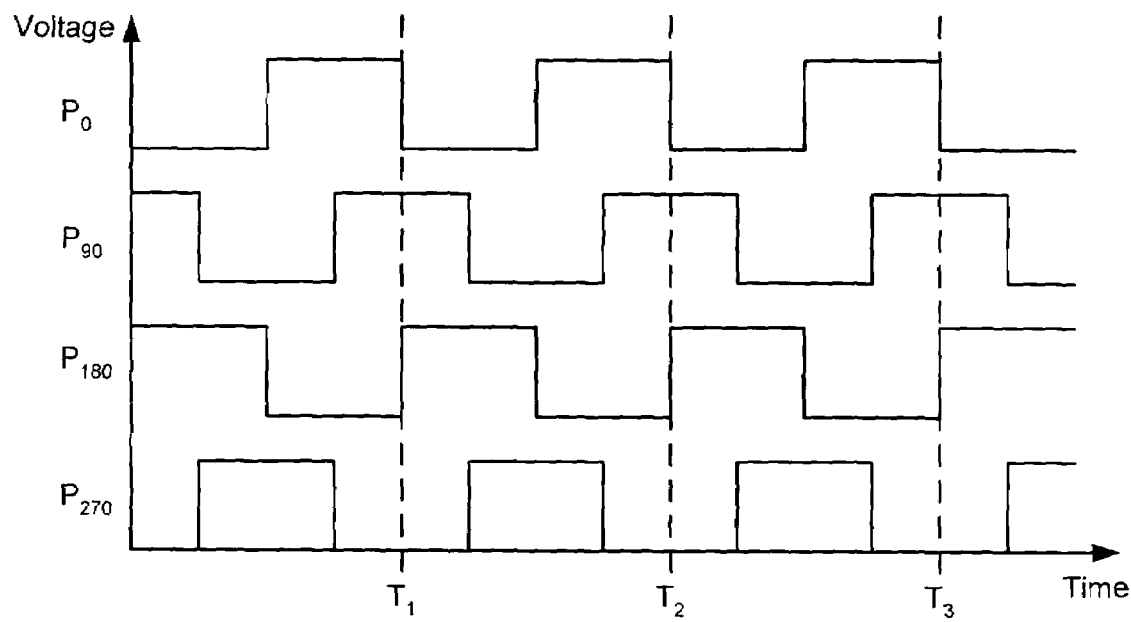

FIG. 2b depicts graphical representations of the phases $P_0$, $P_{90}$, $P_{180}$, and $P_{270}$ of the source clock generated by the phase generator 102 (see FIG. 2a). As shown in FIG. 2b, the four phases $P_0$, $P_{90}$, $P_{180}$, and $P_{270}$ are essentially evenly spaced (90° apart). It is understood that the phases $P_{90}$, $P_{180}$, and $P_{270}$ represent clock phases that are 90, 180, and 270 degrees offset, respectively, from the phase $P_0$.

It should also be understood that the phases $P_0$, $P_{90}$, $P_{180}$, and $P_{270}$ of the source clock define four phase sectors spanning from 0° to 360°. Further, the phase selector/interpolator 106 (see FIG. 1) selects two of the four phases $P_0$, $P_{90}$, $P_{180}$, and $P_{270}$ and combines the selected phases to generate a phase within a respective sector that is a fixed number of degrees offset from the phase $P_0$. For example, the phase selector/interpolator 106 may select and combine the phases 0° and 90° to generate a phase within a $1^{st}$ sector; the phase selector/interpolator 106 may select and combine the phases 90° and 180° to generate a phase within a $2^{nd}$ sector; the phase selector/interpolator 106 may select and combine the phases 180° and 270° to generate a phase within a $3^{rd}$ sector; and, the phase selector/interpolator 106 may select and combine the phases 270° and 0° to generate a phase within a $4^{th}$ sector. The above-mentioned Sector Codes SC0, SC1 are indicative of the sector in which the phase selector/interpolator 106 is operating, and the above-mentioned Thermometer Codes TC0, TC1 determine the weight that each of the phases $P_0$, $P_{90}$, $P_{180}$, and $P_{270}$ contributes to the interpolator output signal $Clk_{out}$.

Figure 3:
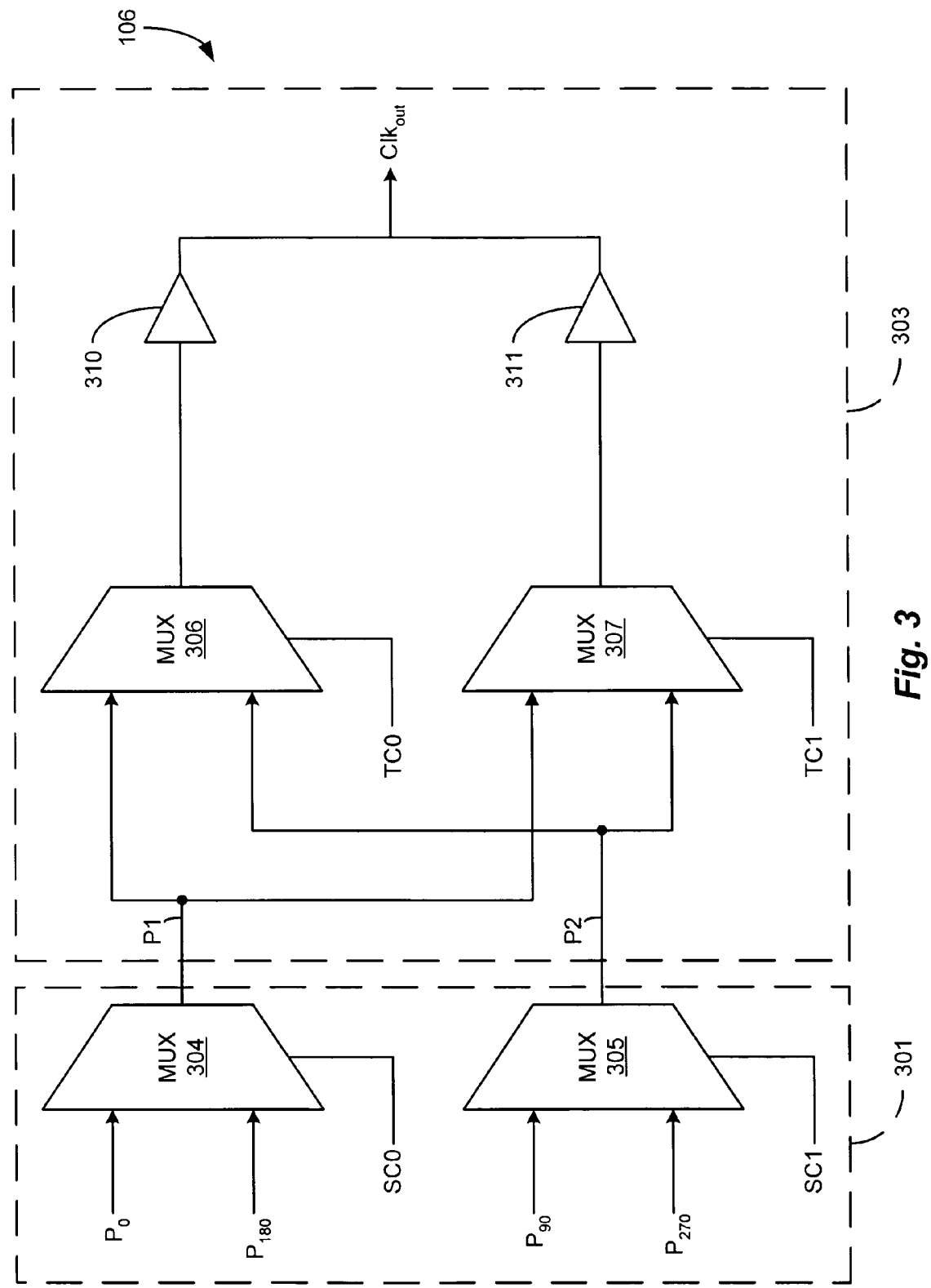
FIG. 3 is a logic diagram of a phase selector/interpolator included in the clock synthesizer of FIG. 1.

FIG. 3 depicts an illustrative embodiment of the phase selector/interpolator 106 included in the clock synthesizer 100 (see FIG. 1). As shown in FIG. 3, the phase selector/interpolator 106 comprises a phase selector 301 and a phase interpolator 303. The phase selector 301 includes a plurality of multiplexors (MUXs) 304-305, which are configured to select two of the four phases $P_0$, $P_{90}$, $P_{180}$, and $P_{270}$ based on the logical values of the Sector Codes SC0, SC1 applied thereto. The phase interpolator 303 includes a plurality of MUXs 306-307 and associated output buffers 310-311. The MUXs 304-305 provide outputs P1-P2, respectively, to the MUXs 306-307, each of which is configured to select between the outputs P1-P2 based on the logical values of the Thermometer Codes TC0, TC1 applied thereto. The MUXs 306-307 provide their respective outputs to the buffers 310-311, the outputs of which are combined to generate the output clock signal $Clk_{out}$.

For example, in the event SC0=SC1=0, the MUX 304 provides the phase $P_0$ as its output P1 and the MUX 305 provides the phase $P_{90}$ as its output P2. It is noted that in the event SC0=SC1=1, the MUX 304 alternatively provides the phase $P_{180}$ as its output P1 and the MUX 305 alternatively provides the phase $P_{270}$ as its output P2. When the phase selector 301 provides the phases $P_0$ and $P_{90}$ to the phase interpolator 303, the phase interpolator 303 operates in the $1^{st}$ sector. For clarity of discussion, it is assumed that the MUXs 304-307 and the output buffers 310-311 have zero delays associated therewith.

As a result, in the event TC0=TC1=0, the MUXs 306-307 each provide the output P1, i.e., the phase $P_0$, at their respective outputs, which are provided via the output buffers 310-311 as the output clock $Clk_{out}$. In the event TC0=0 and TC1=1, the MUXs 306-307 provide the outputs P1 (i.e., the phase $P_0$) and P2 (i.e., the phase $P_{90}$) at their respective outputs, which are combined via the output buffers 310-311 to generate a phase half way between the phases $P_0$ and $P_{90}$ (i.e., a phase $P_{45}$) as the output clock $Clk_{out}$. In the event TC0=TC1=1, the MUXs 306-307 each provide the output P2, i.e., the phase $P_{90}$, at their respective outputs, which are provided via the output buffers 310-311 as the output clock $Clk_{out}$.

Figure 4:
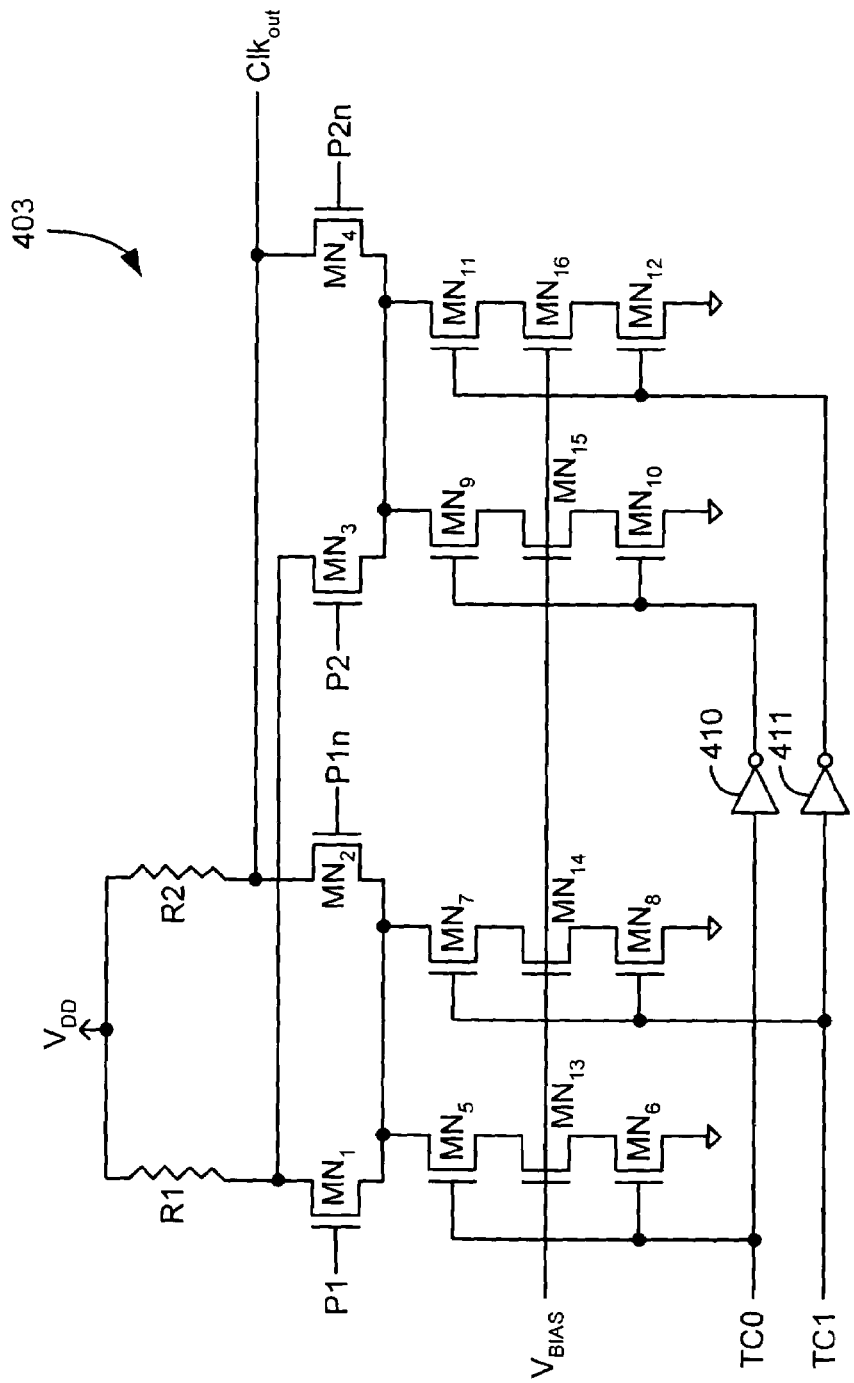
FIG. 4 is a schematic diagram of a representative implementation of the phase interpolator of FIG. 3.

FIG. 4 depicts a representative implementation 403 of the phase interpolator 303 (see FIG. 3). In the illustrated embodiment, the phase interpolator 403 is a differential interpolator comprising a plurality of switching elements including n-channel transistors $MN_1$-$MN_{16}$, a pair of pull-up resistors R1-R2, and inverters 410-411. The Thermometer Codes TC0-TC1 are applied to the gates of the transistors MN5-MN6 and MN7-MN8, respectively, and inverted forms of the codes TC0-TC1 are applied to the gates of the transistors MN9-MN10 and MN11-MN12, respectively. Further, the inputs P1-P2 (see also FIG. 3) are applied to the gates of the transistors MN1 and MN3, and inverted forms of the inputs P1-P2 (i.e., P1n-P2n) are applied to the gates of the transistors MN2 and MN4, respectively. Moreover, a voltage $V_{BIAS}$ is applied to the gates of the transistors MN13-MN16 for suitably biasing the differential interpolator 403. For example, in the event SC0=SC1=0 (i.e., P1=$P_0$ and P2=$P_{90}$) and TC0=1, TC1=0, the output clock $Clk_{out}$ is equal to $P_{45}$, which is half way between the phases 0° and 90°.

In the presently disclosed embodiment, the control circuitry 104 comprises a Finite State Machine (FSM; not shown) having a plurality of states, as defined in TABLE 1 below.

TABLE 1

| State | SC0 | SC1 | TC0 | TC1 | Phase at $Clk_{out}$ |
|---|---|---|---|---|---|
| 0 | 0 | 0 | 0 | 0 | $P_0$ |
| 1 | 0 | 0 | 1 | 0 | $P_{45}$ |
| 2 | 0 | 0 | 1 | 1 | $P_{90}$ |
| 3 | 1 | 0 | 1 | 1 | $P_{90}$ |
| 4 | 1 | 0 | 1 | 0 | $P_{135}$ |
| 5 | 1 | 0 | 0 | 0 | $P_{180}$ |
| 6 | 1 | 1 | 0 | 0 | $P_{180}$ |
| 7 | 1 | 1 | 1 | 0 | $P_{225}$ |
| 8 | 1 | 1 | 1 | 1 | $P_{270}$ |
| 9 | 0 | 1 | 1 | 1 | $P_{270}$ |
| 10 | 0 | 1 | 1 | 0 | $P_{315}$ |
| 11 | 0 | 1 | 0 | 0 | $P_0$ |
| 0 | 0 | 0 | 0 | 0 | $P_0$ |

Accordingly, the Sector Codes SC0=SC1=0 indicate that the phase interpolator 303 is operating in the $1^{st}$ sector comprising the states 0-2 and the phases $P_0$, $P_{45}$, and $P_{90}$; the Sector Codes SC0=1, SC1=0 indicate that the phase interpolator 303 is operating in the $2^{nd}$ sector comprising the states 3-5 and the phases $P_{90}$, $P_{135}$, and $P_{180}$; the Sector Codes SC0=SC1=1 indicate that the phase interpolator 303 is operating in the $3^{rd}$ sector comprising the states 6-8 and the phases $P_{180}$, $P_{2255}$, and $P_{270}$; and, the Sector Codes SC0=0, SC1=1 indicate that the phase interpolator 303 is operating in the $4^{th}$ sector comprising the states 9-11 and the phases $P_{270}$, $P_{315}$, and $P_0$.

Whereas the phases $P_0$, $P_{90}$, $P_{180}$, and $P_{270}$ are originally generated by the phase generator 102 (see FIG. 2), the phases $P_{45}$, $P_{135}$, $P_{225}$, and $P_{315}$ are originated by the phase interpolator 303 (see FIG. 3) based on the logical values of SC0, SC1 and TC0, TC1 listed in TABLE 1 above. For clarity of discussion, the "Phases at $Clk_{out}$" listed in TABLE 1 above are based on the assumption that the MUXs 304-307 and the output buffers 310-311 included in the phase selector/interpolator 106 (see FIG. 3) have zero delay.

It is noted that one of ordinary skill in the art can design and implement a suitable FSM circuit for generating the values of SC0, SC1, TC0, and TC1 listed in TABLE 1 above. Such an FSM included in the control circuitry 104 (see FIG. 1) may be configured to change states every cycle of the clock provided on the line 110. Thus, the Thermometer Codes TC0, TC1 may be updated every cycle of the clock, and the Sector Codes SC0, SC1 may be updated every third cycle of the clock. In the presently disclosed embodiment, the phase $P_0$ is provided as the clock for the FSM.

The clock synthesizer 100 (see FIG. 1) employs the phase selector/interpolator 106 for effectively inserting (removing) at least one cycle into (from) the source clock over a predetermined number of source clock cycles to derive the output clock $Clk_{out}$ having the desired stepped up (stepped down) clock frequency. In the illustrated embodiment, because the phase $P_0$ is employed as the clock for the above-described FSM, the clock synthesizer 100 can effectively insert (remove) 1 cycle into (from) the source clock over 12 cycles of the source clock to derive the output clock $Clk_{out}$ with the desired stepped up (stepped down) frequency.

Specifically, to derive the output clock $Clk_{out}$ with a stepped up frequency, the FSM is controlled via a suitable value of the Direction control signal to successively transition to the next numerically lower state (e.g., states 11→10→9→ . . . →1→0→11→10→ . . . ; see TABLE 1) every cycle of the phase $P_0$. To derive the output clock $Clk_{out}$ with a stepped down frequency, the FSM is controlled via a suitable value of the Direction control signal to successively transition to the next numerically higher state (e.g., states 0→1→2→ . . . →10→11→0→1→ . . . ; see TABLE 1) every cycle of the phase $P_0$.

Figure 5A:
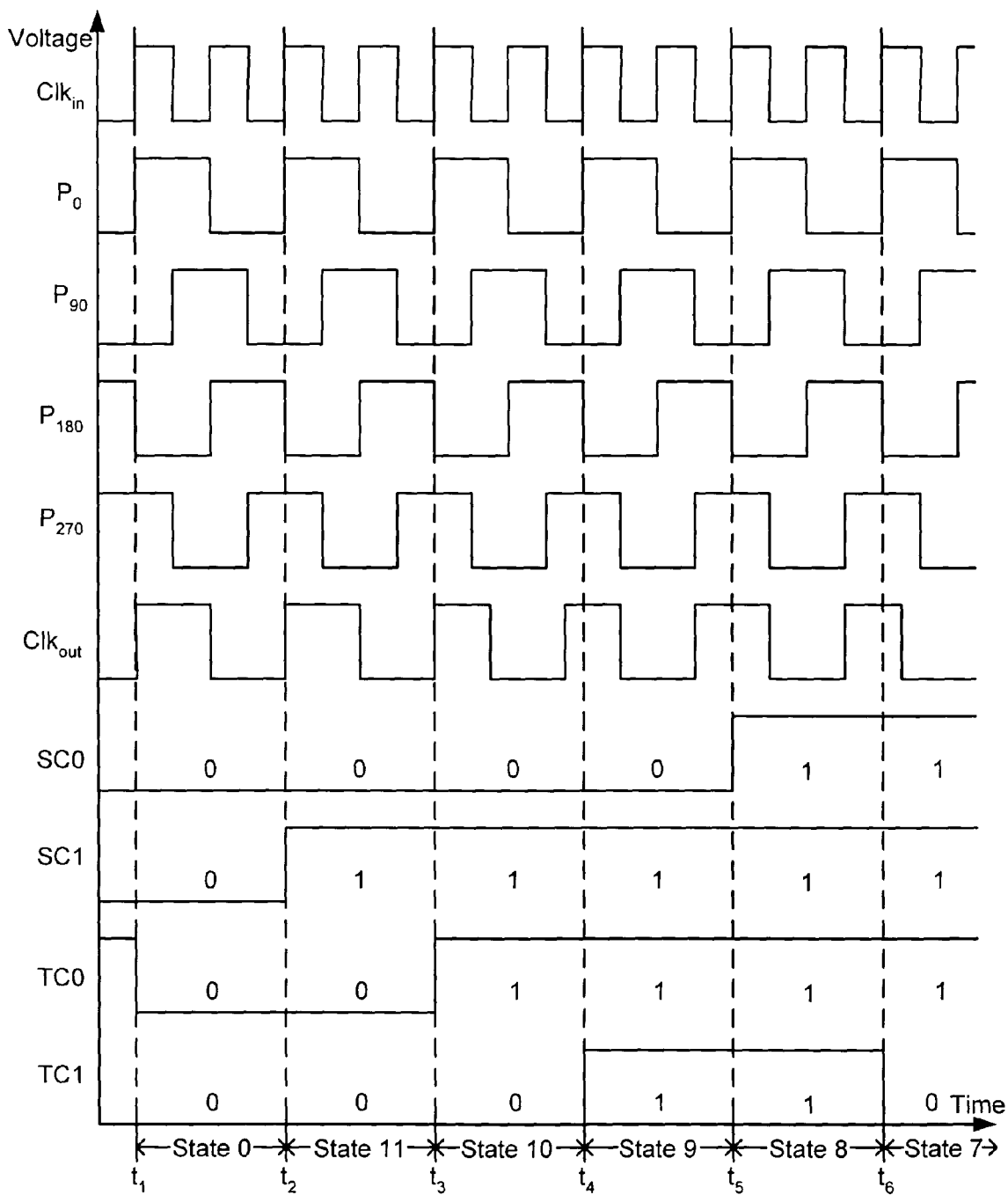
FIGS. 5a-5b are timing diagrams illustrating the operation of the clock synthesizer of FIG. 1, in which at least one clock cycle is effectively inserted into a source clock signal over predetermined numbers of source clock cycles.

FIG. 5a depicts a timing diagram illustrating the operation of the clock synthesizer 100 (see FIG. 1), in which 1 clock cycle is effectively inserted into the source clock over 12 source clock cycles to derive the output clock $Clk_{out}$ with a stepped up frequency. As shown in FIG. 5a, the frequency of the high speed clock $Clk_{in}$ is two times the frequency of the source clock. Further, the FSM is controlled to successively transition to the next numerically lower state, i.e., states 0→11→10→9→8→ . . . , during time intervals $t_1$-$t_2$, $t_2$-$t_3$, $t_3$-$t_4$, $t_4$-$t_5$, $t_5$-$t_6$, . . . respectively, every cycle of the phase $P_0$. As a result, during states 0, 11, 10, 9, 8, and 7, the phase at the output clock $Clk_{out}$ is $P_0$ (corresponding to the $1^{st}$ sector); $P_0$, $P_{315}$, and $P_{270}$ (corresponding to the $4^{th}$ sector); and, $P_{270}$ and $P_{225}$ (corresponding to the $3^{rd}$ sector), respectively, in accordance with TABLE 1 above.

In effect, the clock synthesizer 100 produces a lagging phase shift of about 360/P(Q−1)=45 degrees with each state transition within the respective sectors, in which P=4 (i.e., the number of sectors) and Q=3 (i.e., the number of phases of the source clock $Clk_{in}$ within each sector), to produce the output clock $Clk_{out}$ with the stepped up frequency. It is understood that the FSM may be controlled to successively transition to the next numerically higher state, i.e., states 0→1→2→3→4→ . . . , to produce a leading phase shift of about 45 degrees with each state transition to produce the output clock Clk$_{out}$ with a stepped down frequency.

As described above, the output clock Clk$_{out}$ having the stepped up frequency is derived by controlling the FSM to successively transition to the next numerically lower state (e.g., states 11→10→9→ . . . →1→0→11→10→ . . . ; see TABLE 1) every cycle of the phase P$_0$. It should be noted that the FSM may alternatively be configured so that a cycle of the phase P$_0$ is not required to transition from state 0 to 11, from state 9 to 8, from state 6 to 5, and from state 3 to 2.

Figure 5B:
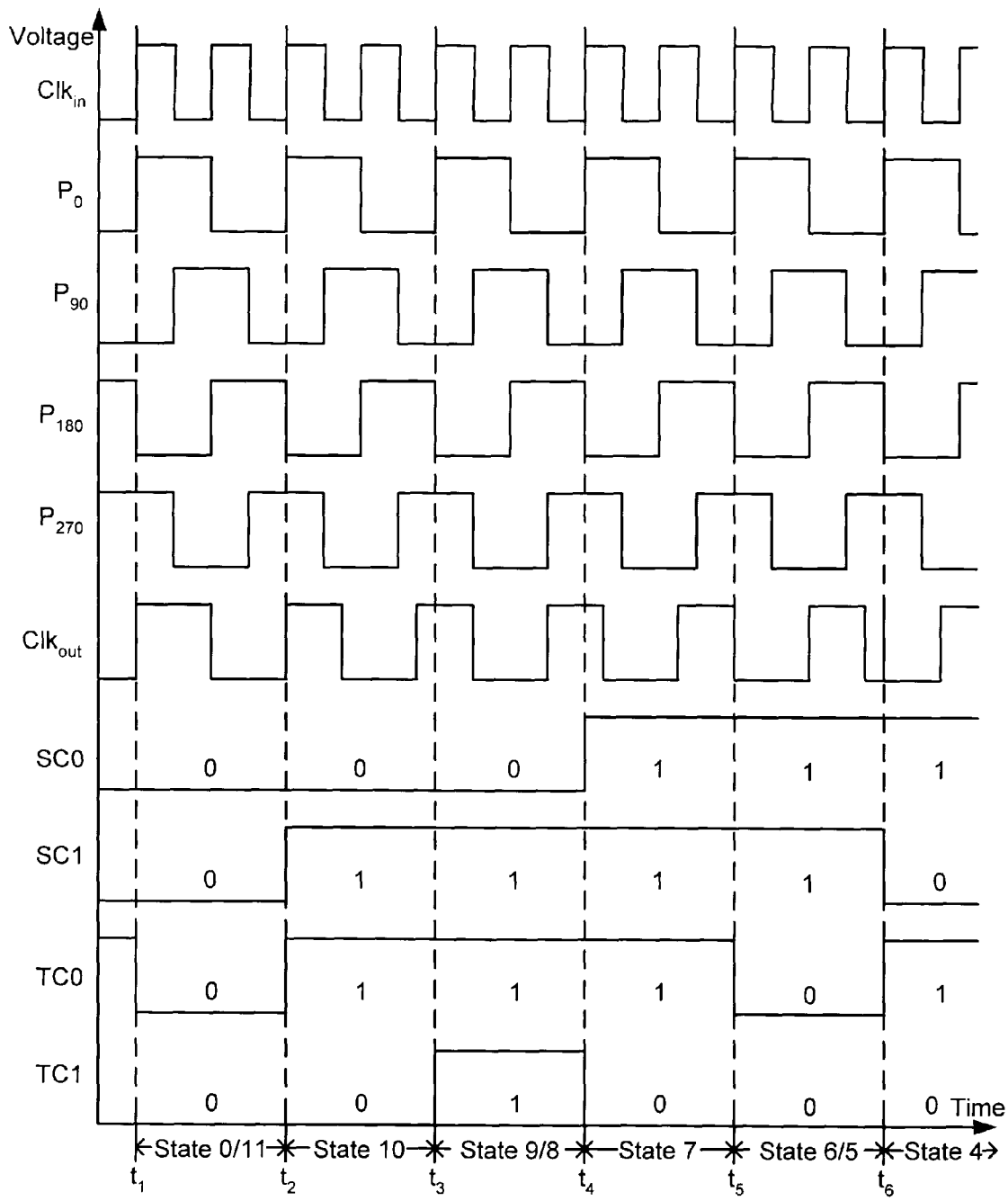

As a result, as shown in FIG. 5*b*, the clock synthesizer 100 can effectively insert 1 cycle into the source clock over 8 cycles of the source clock to derive the output clock Clk$_{out}$ with the desired stepped up frequency. The frequency of the high speed clock Clk$_{in}$ is two times the frequency of the source clock, and the FSM is controlled to successively transition to the next numerically lower state, i.e., states 0/11→10→9/8→7→6/5→ . . . , during time intervals t$_1$-t$_2$, t$_2$-t$_3$, t$_3$-t$_4$, t$_4$-t$_5$, t$_5$-t$_6$, . . . respectively, every cycle of the phase P$_0$. It is noted that the state notation 0/11, 9/8, 6/5, and 3/2 is employed to indicate that the states in each state pair, i.e., states 0 and 11, states 9 and 8, states 6 and 5, and states 3 and 2, effectively correspond to the same state. As shown in FIG. 5*b*, the clock synthesizer 100 produces a lagging phase shift of about 45 degrees with each state transition to produce the output clock Clk$_{out}$ with the stepped up frequency. It is understood that the clock synthesizer 100 may effectively remove 1 cycle from the source clock over 8 cycles of the source clock to derive the output clock Clk$_{out}$ with the desired stepped down frequency.

Figure 6:
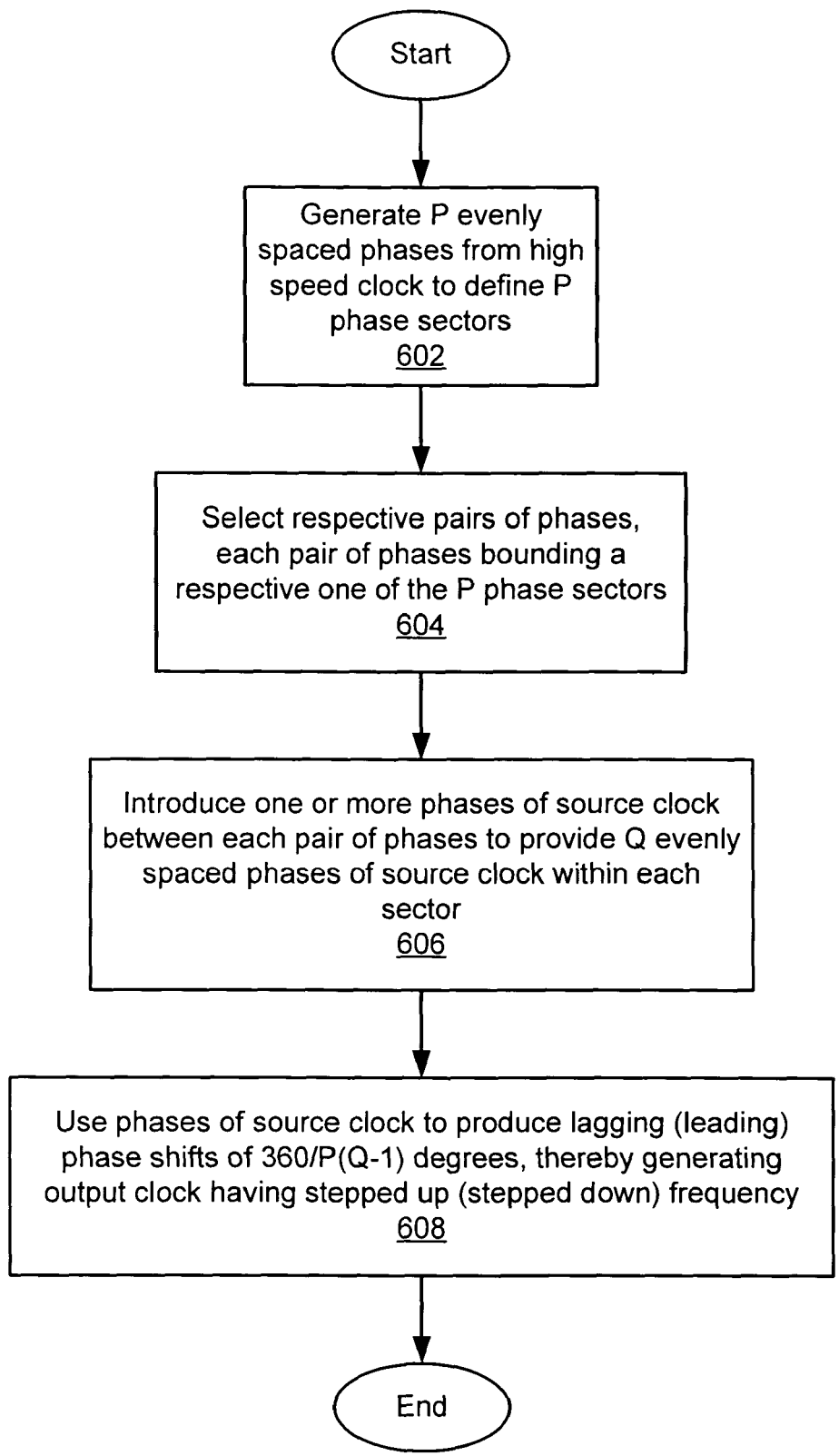
FIG. 6 is a flow diagram illustrating a method of operating the clock synthesizer of FIG. 1.

A method of operating the presently disclosed clock synthesizer is illustrated by reference to FIG. 6. As depicted in step 602, a phase generator receives a high speed clock Clk$_{in}$ and generates P (P≧4) evenly spaced phases of a source clock therefrom, defining P phase sectors. A phase selector then receives the P phases of the source clock and successively selects, as depicted in step 604, respective pairs of phases such that each pair bounds a respective one of the P phase sectors. Next, a phase interpolator successively receives the selected phases of the source clock and introduces, as depicted in step 606, one or more phases of the source clock between each pair of phases to provide Q evenly spaced phases within each sector. Finally, the phase interpolator uses, as depicted in step 608, the phases of the source clock to produce lagging (leading) phase shifts of about 360/P(Q−1) degrees, thereby generating an output clock Clk$_{out}$ having at least one clock cycle more (i.e., a stepped up frequency) or at least one clock cycle less (i.e., a stepped down frequency) than the source clock over a predetermined number of source clock cycles.

Having described the above illustrative embodiment, other alternative embodiments or variations may be made. For example, it was described that the clock synthesizer operates within 4 phase sectors of the source clock signal, and that the phase interpolator generates 3 phases of the source clock within each sector. However, in an alternative embodiment, the clock synthesizer may operate in a greater number of sectors and the phase interpolator may generate more phases of the source clock within each sector to make resulting phase jumps in the interpolator output signal less abrupt. It was further described that the FSM is driven by a selected one of the four phases P$_0$, P$_{90}$, P$_{180}$, and P$_{270}$. It is understood, however, that the output of the phase interpolator may alternatively be used to drive the FSM. Moreover, it was described that the FSM is controlled to successively transition to the next numerically lower or higher state every cycle of the phase P$_0$. However, the FSM may alternatively be configured to transition to the next state on both the rising and the falling edges of the control circuitry clock to reduce jitter in the interpolator output signal. It should be appreciated that the phase generator may comprise a ring oscillator or a coupled LC oscillator that is part of a Phase Locked Loop (PLL) or a Delay Locked Loop (DLL), or any other suitable type of phase generator.

It will further be appreciated by those of ordinary skill in the art that modifications to and variations of the above-described method and apparatus for synthesizing a clock signal having a frequency near the frequency of a source clock signal may be made without departing from the inventive concepts disclosed herein. Accordingly, the invention should not be viewed as limited except as by the scope and spirit of the appended claims.

What is claimed is:

1. A clock synthesizer for deriving at least one output clock signal from a source clock signal, comprising:
   a phase generator configured to generate a predetermined number of phases of the source clock signal, the phases of the source clock signal defining a plurality of phase sectors;
   a phase selector configured to select respective pairs of the phases of the source clock signal, each selected pair of phases bounding a respective one of the phase sectors; and
   a phase interpolator, wherein the phase interpolator receives at least one of the respective pairs of the phases of the source clock, wherein the source clock signal operates at a first frequency, wherein the phase interpolator combines the at least one of the respective pairs of the phases of the source clock to generate the output clock signal, wherein the output clock signal has at least one clock cycle inserted into the source clock signal, wherein the output clock signal operates at a second frequency that is greater than the first frequency.

2. The clock synthesizer of claim 1,
   wherein the phase generator is configured to generate a predetermined number P of phases of the source clock signal, the P phases of the source clock signal defining P phase sectors, and
   wherein the phase interpolator is configured to introduce at least one phase of the source clock signal between each pair of phases to provide a predetermined number Q of phases of the source clock signal within each phase sector,
   the phase interpolator being further configured to successively output the phases of the source clock signal to produce lagging or leading phase shifts of about 360/P(Q−1) degrees to derive the output clock signal having a stepped up frequency.

3. The clock synthesizer of claim 1 wherein the phase generator is configured to generate the first predetermined number of evenly spaced phases of the source clock signal.

4. The clock synthesizer of claim 1 wherein the phase interpolator is configured to introduce at least one phase of the source clock signal between each pair of phases to provide a second predetermined number of evenly spaced phases of the source clock signal within each phase sector.

5. The clock synthesizer of claim 1 further including control circuitry configured to control the phase selector and the phase interpolator, the control circuitry including a state machine having a plurality of states, the phase interpolator being configured to successively output the phases of the source clock signal based on the plurality of states.

6. The clock synthesizer of claim 5 wherein the plurality of states comprises a plurality of ordered states, and the control circuitry is configured to transition through the states in a forward or reverse order to derive the output clock signal.

7. The clock synthesizer of claim 5 wherein each state corresponds to a respective combination of sector codes and thermometer codes, each sector code corresponding to a respective one of the phase sectors, each thermometer code corresponding to a weight that each one of the first predetermined number of phases of the source clock signal contributes to the derivation of the output clock signal.

8. The clock synthesizer of claim 1 wherein the phase generator is configured to generate the first predetermined number of phases of the source clock signal from a high frequency signal that is at least two times a desired frequency of the source clock signal.

9. The clock synthesizer of claim 1 wherein the phase generator is selected from the group consisting of a ring oscillator and a coupled LC oscillator.

10. The clock synthesizer of claim 1, wherein the first frequency corresponds to a first data rate of a first data set, and wherein the second frequency corresponds to a second data rate of a second data set.

11. The clock synthesizer of claim 10, wherein the second data set is an encoded version of the first data set.

12. A method of operating a clock synthesizer to derive at least one output clock signal from a source clock signal, comprising the steps of:
   generating a predetermined number of phases of the source clock signal by a phase generator, the phases of the source clock signal defining a plurality of phase sectors;
   selecting respective pairs of the phases of the source clock signal by a phase selector, each selected pair of phases bounding a respective one of the phase sectors;
   combining at least one of the respective pairs of the phases of the source clock to generate an output clock signal, wherein the output clock signal has at least one clock cycle inserted into the source clock signal; and
   successively outputting the phases of the source clock signal to derive the output clock signal having a stepped up frequency by the phase interpolator, wherein the source clock signal operates at a first frequency, and wherein the output clock signal operates at a second frequency that is distinct from and greater than the first frequency.

13. The method of claim 12,
   wherein the generating step includes generating a predetermined number P of phases of the source clock signal, the P phases of the source clock signal defining P phase sectors,
   wherein the combining step includes introducing at least one phase of the source clock signal between each pair of phases to provide a predetermined number Q of phases of the source clock signal within each phase sector, and
   wherein the outputting step includes successively output the phases of the source clock signal to produce lagging or leading phase shifts of about 360/P(Q−1) degrees to derive the output clock signal having the stepped up or stepped down frequency.

14. The method of claim 13 wherein the predetermined number P of phases of the source clock signal is greater than or equal to 4.

15. The method of claim 12 wherein the generating step includes generating the first predetermined number of evenly spaced phases of the source clock signal.

16. The method of claim 12 wherein the combining step includes introducing at least one phase of the source clock signal between each pair of phases to provide the second predetermined number of evenly spaced phases of the source clock signal within each phase sector.

17. The method of claim 12 further including the step of controlling the phase selector and the phase interpolator by control circuitry, the control circuitry including a state machine having a plurality of states, and wherein the outputting step includes successively outputting the phases of the source clock signal based on the plurality of states.

18. The method of claim 17 wherein the plurality of states comprises a plurality of ordered states, and wherein the controlling step includes transitioning through the states in a forward or reverse order to derive the output clock signal.

19. The method of claim 17 wherein each state corresponds to a respective combination of sector codes and thermometer codes, each sector code corresponding to a respective one of the phase sectors, each thermometer code corresponding to a weight that each one of the first predetermined number of phases of the source clock signal contributes to the derivation of the output clock signal.

20. The method of claim 12 wherein the generating step includes generating the first predetermined number of phases of the source clock signal from a high frequency signal that is at least two times a desired frequency of the source clock signal.

21. The method of claim 12 wherein the phase interpolator comprises a differential interpolator.

22. A clock synthesizer for deriving a frequency modified clock signal, comprising:
   a source clock signal operating at a first frequency;
   a phase generator configured to generate a number of phases of the source clock signal that define a plurality of phase sectors;
   a phase selector configured to select a pair of the phases of the source clock signal, wherein the selected pair of phases bound a respective one of the phase sectors; and
   a phase interpolator, wherein the phase interpolator receives the selected pair of the phases of the source clock, wherein the phase interpolator combines the selected pair of the phases of the source clock to generate an output clock signal, wherein the output clock signal has at least one clock cycle deleted from the source clock signal, and wherein the output clock signal operates at a second frequency that is less than the first frequency.

23. The clock synthesizer of claim 22,
   wherein the phase generator is configured to generate a predetermined number P of phases of the source clock signal, the P phases of the source clock signal defining P phase sectors, and
   wherein the phase interpolator is configured to introduce at least one phase of the source clock signal between each pair of phases to provide a predetermined number Q of phases of the source clock signal within each phase sector,
   the phase interpolator being further configured to successively output the phases of the source clock signal to produce lagging or leading phase shifts of about 360/P(Q−1) degrees to derive the output clock signal having a stepped down frequency.

24. The clock synthesizer of claim 22, wherein the first frequency corresponds to a first data rate of a first data set, wherein the second frequency corresponds to a second data rate of a second data set, and wherein the second data set is a decoded version of the first data set.

25. The clock synthesizer of claim 22, wherein the phase interpolator is configured to introduce at least one phase of the source clock signal between each pair of phases to provide a second predetermined number of evenly spaced phases of the source clock signal within each phase sector.

* * * * *